TIME DELAY CIRCUIT EMPLOYING LOGIC GATE
Filed Aug. 20, 1965 4 Sheets-Sheet 1
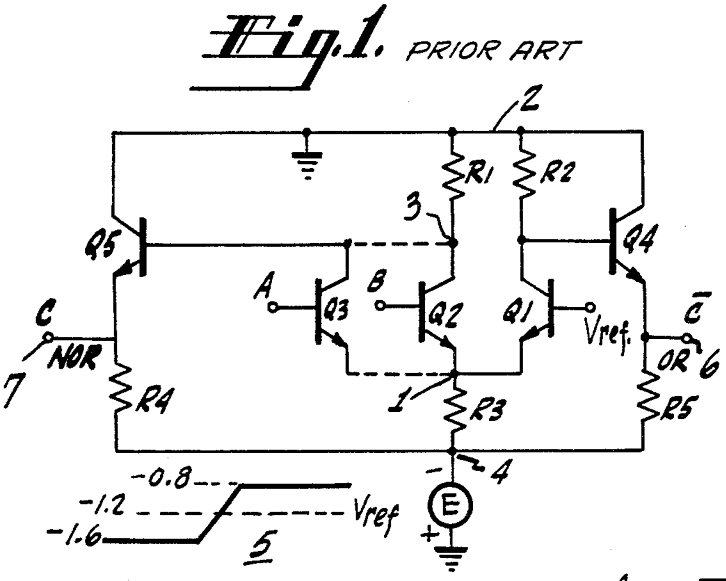
FIG. 1. PRIOR ART
FIG. 2.
| A | B | C | $\bar{C}$ |
|---|---|---|---|
| H | H | L | H |
| H | L | L | H |
| L | H | L | H |
| L | L | H | L |
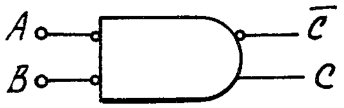
FIG. 3.
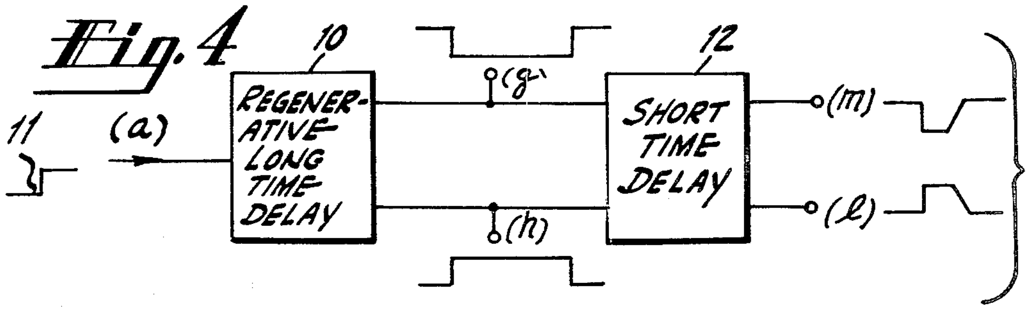
FIG. 4
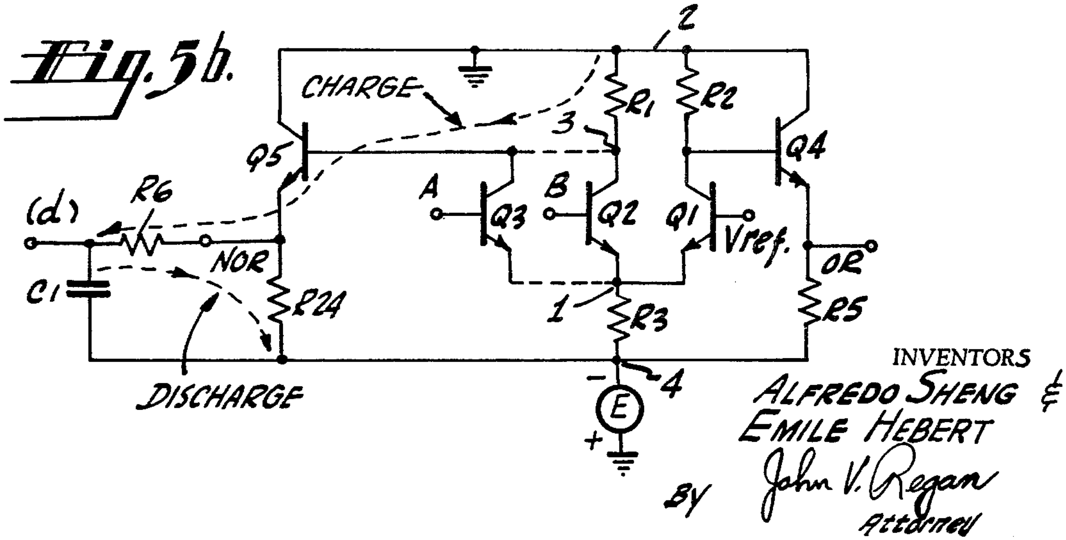
FIG. 5b.
INVENTORS
ALFREDO SHENG &
EMILE HEBERT
BY John V. Regan
Attorney INVENTORS
ALFREDO SHENG &
EMILE HEBERT
BY John V. Regan
Attorney

TIME DELAY CIRCUIT EMPLOYING LOGIC GATE

Filed Aug. 20, 1963 4 Sheets-Sheet 3

INVENTORS
ALFREDO SHENG &
EMILE HEBERT
BY John V. Regan
Attorney

TIME DELAY CIRCUIT EMPLOYING LOGIC GATE

Filed Aug. 20, 1965 4 Sheets-Sheet 4

INVENTORS
ALFREDO SHENG &
EMILE HEBERT
BY John V. Regan
attorney 3,396,282
Patented Aug. 6, 1968

3,396,282

TIME DELAY CIRCUIT EMPLOYING LOGIC GATE

Alfredo Sheng, Cherry Hill, and Emile Hebert, Willingboro, N.J., assignors to Radio Corporation of America, a corporation of Delaware Filed Aug. 20, 1965, Ser. No. 481,283
9 Claims. (Cl. 307—208)

ABSTRACT OF THE DISCLOSURE

A logic gate and capacitor arrangement are described for obtaining time delay. In the illustrated example, current mode type gates with complementary outputs are employed together with capacitors and a waveshaper to obtain a regenerative long time delay followed by a short time delay.

This invention relates to data processing equipment, and more particularly to data processing circuitry which comprises like or similar logical gating elements for performing a delay or one-shot multivibrator function.

Advances in semiconductor integrated circuit technology have provided the computer circuit designer with logical gate elements in the form of monolithic integrated circuits in which the component transistors, diodes, resistors and capacitors are all formed, as by diffusion, in the same piece of semiconductor material, such as silicon. These logical gate elements may be fabricated such that one or more such gate elements may be formed in the same monolithic circuit package. The logical gate elements, being identical, all use the same value of supply voltage and all respond to and provide substantially identical digital signals of which the rise and fall or transition times between two logic levels are substantially identical. A particular type of integrated logical gate element, known as the emitter-coupled, current steering logic gate (ECCSL), is usually biased so as to respond to digital signals when the rise or fall is midway between the two logic voltage levels corresponding to the threshold of the logic gate. The rise and fall times of the digital signals are generally so short that the midpoint between the logic levels is passed very rapidly with the result that the gates switch almost instantaneously. In other words, the transition between the two voltage levels have relatively steep slopes.

The task of the computer designer is to design conventional data processing circuits, such as flip-flops, one-shot multivibrators, binary registers, counters, and the like using only the integrated circuit packages where possible. The design of delay circuits or one-shot multivibrators requires that the delay be highly accurate. Diffused capacitors and resistors of monolithic circuits are generally subject to temperature variations and therefore are inadequate to provide highly accurate delays. Consequently, it is necessary to interconnect discrete capacitor and resistance networks to the integrated logical gate elements in order to obtain the desired degree of accuracy.

It is an object of this invention to provide a novel one-shot multivibrator or delay circuit.

It is another object of this invention to provide a novel delay circuit which is comprised of like logical gating elements.

In brief, the invention provides an interconnection of emitter-coupled, current-steering logic gates for generating a relatively long delay followed by a relatively short delay, both of which are long compared to the rise and fall or transition times of the digital signals. The longer delay one-shot multivibrator is of a regenerative type including a flip-flop and a first means including a first current-steering logic gate having a capacitance coupled to an output thereof for developing a gradual transition between two digital signal levels in response to the setting of the flip-flop. A second means including a second current-steering logic gate an da waveshaping network detects the equivalence of the gradual transition with a predetermined voltage level intermediate the values of the two digital voltage levels and develops a control transition between the two voltage levels when an equivalence is detected. A third means including a third current-steering logic gate develops first complementary transitions between the two voltage levels when the flip-flop is set and also develops second complementary transitions between the two voltage levels in response to the control transition. A further means is provided to reset the flip-flop with the control transition.

The relatively shorter delay circuit is of a non-regenerative type including a fourth current-steering logic gate having a further capacitance connected to an output thereof for developing a further gradual transition between the two voltage levels in response to the second complementary transitions developed by the third logic gate. A fifth logic gate develops a first output transition between the two voltage levels in response to the second complementary transitions and develops a second output transition when the second gradual transition equals the predetermined voltage level.

FIG. 1 is a circuit diagram of an emitter-coupled, current-steering logic gate according to the prior art;

FIG. 2 is a truth table for the logic gate of FIG. 1;

FIG. 3 is a logical symbol used to represent the logic gate of FIG. 1;

FIG. 4 is a block diagram of a delay system;

FIG. *5a* is a detailed diagram of the interconnection of several of the logic gates of FIG. 1 to perform the delay functions of the block diagram of FIG. 4;

FIG. *5b* is a circuit diagram of a portion of FIG. *5a*; and

Figure 5A:
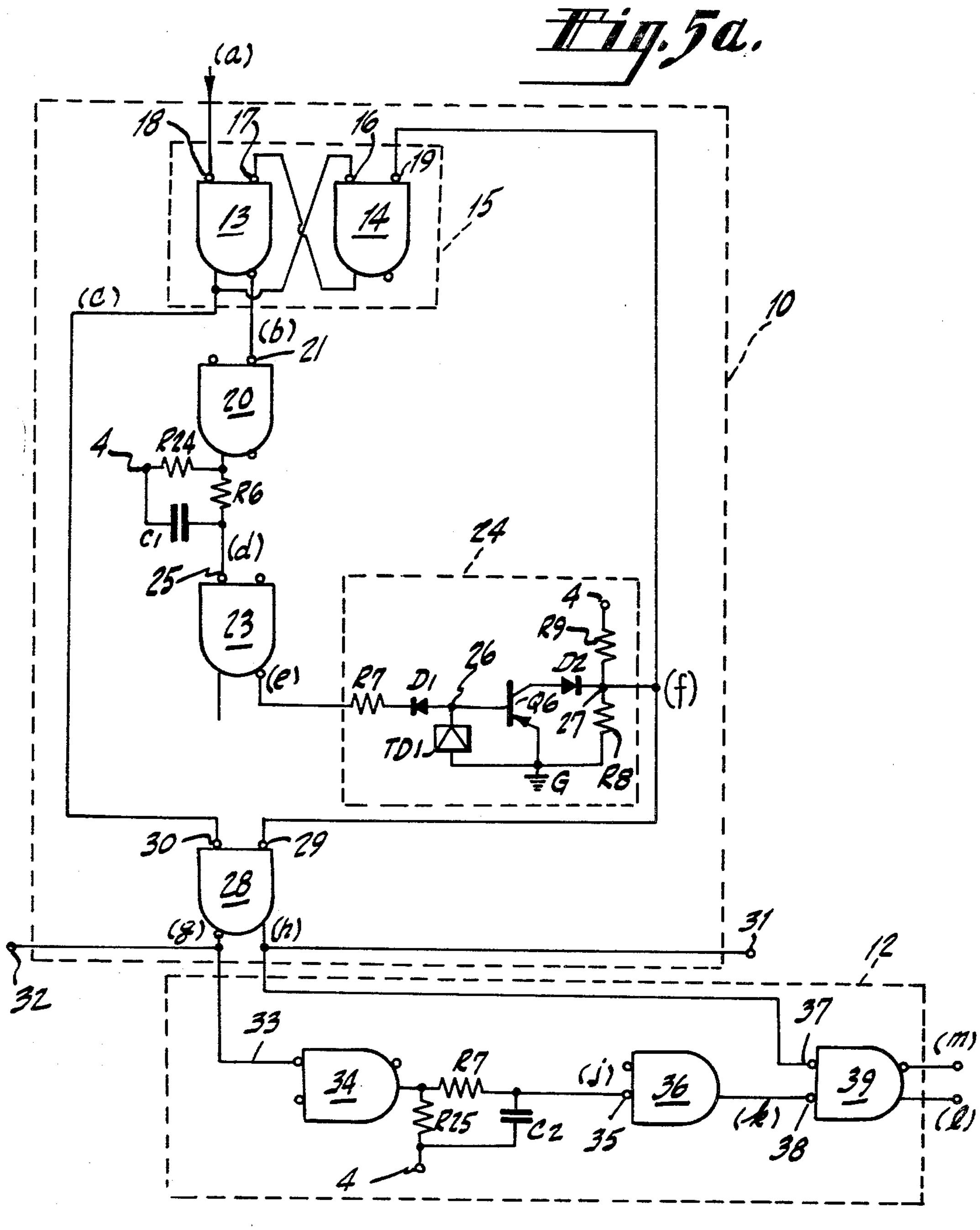
Figure 6:
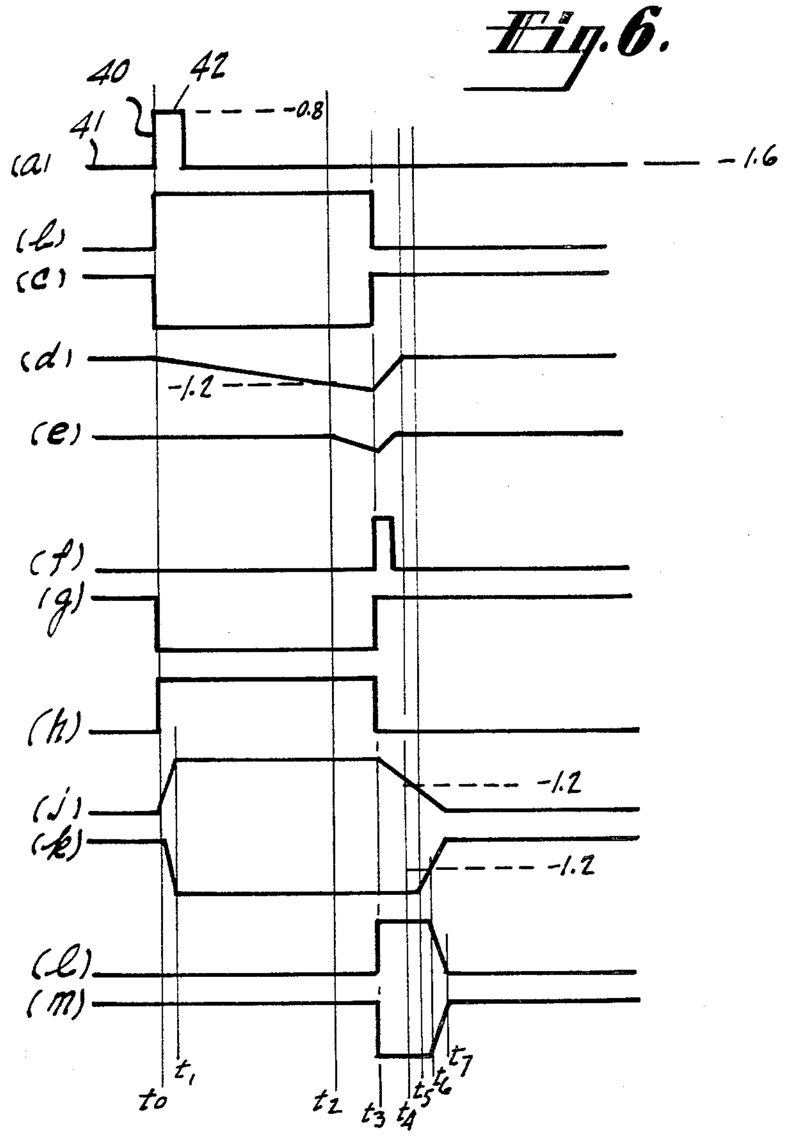
Figure 7:
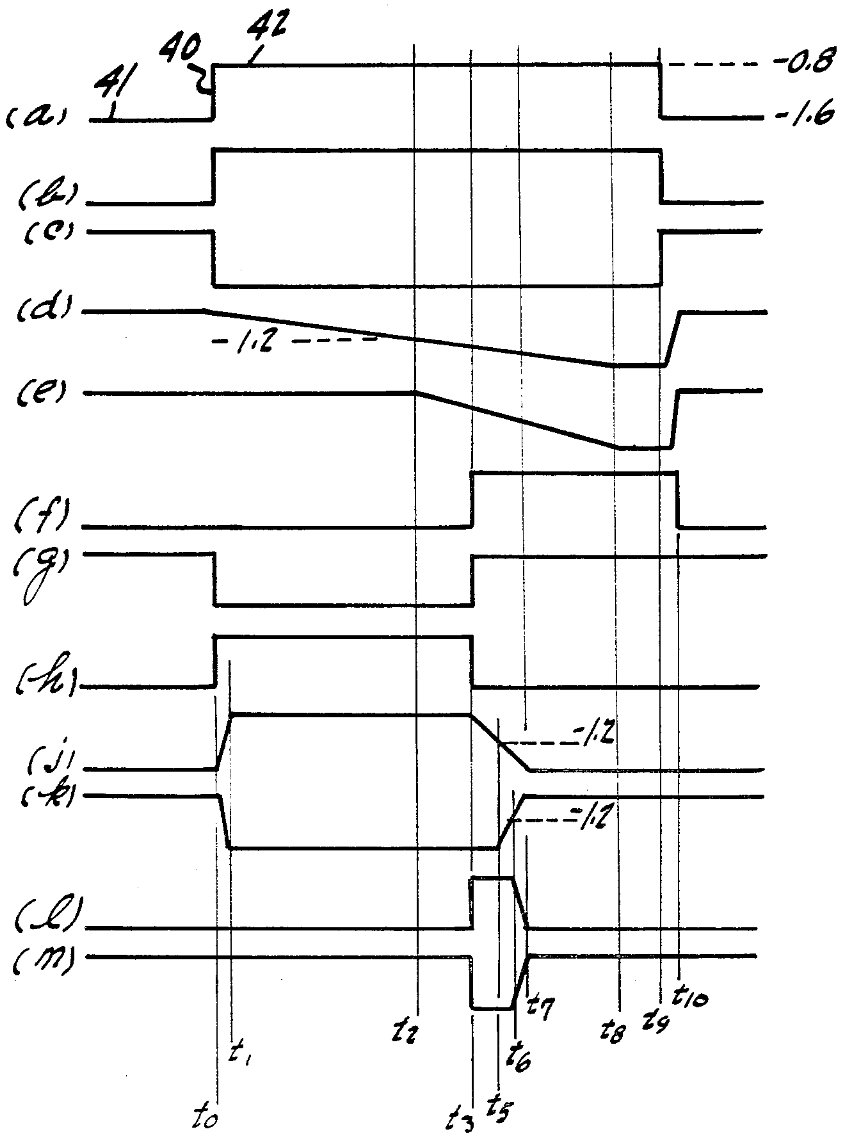

FIGS. 6 and 7 are waveform diagrams taken at various points in the delay system of FIG. 5.

The prior art emitter-coupled, current-steering logic (ECCSL) gate in FIG. 1 includes at least three transistors Q1, Q2 and Q3 each having their emitter electrodes connected in common at circuit point 1. Transistor Q1 has its base electrode connected to a fixed reference voltage supply, designated $V_{ref}$. The collector electrode of transistor Q1 is connected by way of a resistance R2 to a circuit point 2.

The transistors Q2 and Q3 have their collector electrodes connected in common to another circuit point 3 and by way of resistance R1 to the circuit point 2. As indicated by the dashed lines between the emitter and collector electrodes of transistors Q1 and Q2, other transistors (not shown) may have their collector-emitter paths connected between circuit points 1 and 3. A common emitter resistance R3 is connected between the common emitter circuit point 1 and a circuit point 4. Appropriate operating potential, illustrated as a voltage source E of the indicated polarity, is connected between circuit points 2 and 4. The circuit point 2 is arbitrarily considered as the ground reference as indicated by the conventional symbol in FIG. 1.

First and second digital input signals A and B are applied to the base electrodes of transistors Q2 and Q3, respectively. Each of the input signals A and B is at either of two digital voltage levels designated in the truth table of FIG. 2 as H and L for high and low respectively. The input signals A and B may be generated by other logic gates (not shown) similar to the one being described in FIG. 1. In an exemplary computer system, the higher digital level may have a value of 0.8 volt, and the lower digital level may have a value of —1.6 volts, as illustrated by the waveform 5 in FIG. 1. Preferably, the reference supply voltage $V_{ref}$ is selected to have a value of —1.2 volts, midway between these high and low level values.

The current steering logic gate described above operates as follows. When both input signals A and B are at their lower levels of —1.6 volts, transistors Q2 and Q3 are biased in the cut off condition. Transistor Q1 is conductive so that current in the conventional sense flows from circuit ground at circuit point 2 through resistance R2, the collector-emitter path of transistor Q1, and through the common emitter resistance R3 to the voltage source E. The values of the resistors R2 and R3 are selected so that the voltage developed at the collector electrode of transistor Q1 is approximately —0.8 volt when transistor Q1 conducts (assuming a voltage drop of 0.8 volt across the base-emitter junction of a conducting transistor). At this time the voltage at the common collector circuit point 3 is at or near ground potential, since transistors Q1 and Q2 are nonconducting.

When either or both of the input signals A and B begins to change from the lower to the higher digital level, the current-steering logic gate continues to operate as described above until the input signal level just exceeds the midway point of —1.2 volts. At this point transistors Q2 and Q3 tend to become forward biased. Current now flows in the conventional sense from ground at circuit point 2 through the parallel combination of resistance R1 and the collector-emitter paths of the conducting ones of transistors Q2 and Q3 on the one hand, and of resistance R2 and the collector-emitter path of transistor Q1 on the other hand. As the input signal level continues to increase toward the higher level of —0.8 volt, transistor Q1 tends to cut off thereby conducting less and less current. Transistors Q2 and Q3 become more forward biased to conduct more and more current. When the input signal level is at—0.8 volt, transistor Q1 is cut off so that the voltage at its collector electrode is at or near ground potential. The values of resistances R1 and R3 are selected so that the voltage at the common collector circuit point 3 is at approximately —0.8 volt when either or both transistors Q2 and Q3 conducts.

Although the circuit as described above is operative, it is inadequate to drive a large number of output loads such as other like logic gates as is usually the case in data processing systems. The direct connection of a large number of these logic gates to the common collector circuit point 3 would cause a large current to flow in the resistances R1 or R2 and could seriously affect the voltage levels at these points. This is so because the transistors are not connected in the grounded emitter configuration, do not operate in saturation, and have no voltage clamping means at the collector electrode. In order to avoid this condition, a pair of emitter follower transistors Q4 and Q5 are provided to isolate the output loads from the collector emitters of transistors Q1, Q2 and Q3. As is known, an emitter follower transistor has a very high input impedance whereby its base current is relatively small. This small base current flowing through the associated resistances R1 and R2 does not seriously affect the voltage levels at the collectors of transistors Q1, Q2 and Q3.

Emitter follower transistor Q4 has its collector electrode grounded at circuit point 2 and its base electrode connected to the collector electrode of transistor Q1. The emitter electrode of transistor Q4 is connected to an output terminal 6 and by way of resistance R5 to circuit point 4. Emitter follower transistor Q5 has its collector electrode grounded at circuit point 2 and its base electrode connected to the common collector circuit point 3. The emitter electrode of transistor Q5 is connected to an output terminal 7 and by way of resistance R4 to the circuit point 4.

When the voltage level at the common collector circuit point 3 is at ground potential, the voltage at the emitter electrode of transistor Q5 and at the output terminal 7 has a value of —0.8 volt, assuming a voltage drop of 0.8 volt across the emitter base junction of the transistor. On the other hand, when the voltage at the common collector circuit point 3 is at —0.8 volt, the voltage level at output terminal 7 has a value of —1.6 volts. Similarly, the voltage level at the other output terminal 6 has a value of —0.8 volt when the voltage at the collector electrodes of transistor Q1 is at ground potential, and has a value of —1.6 volts when the voltage at collector 16 is at —0.8 volt. Thus, the input and output digital signal levels of the emitter current coupled steering gate are identical.

Generally, the transitions between the two digital levels require a time on the order of 20 nanoseconds or less at room temperature. These transitional rise and fall times, which are applied to the inputs of the current-steering logic gate above described, are substantially reproduced at the outputs thereof with a propagation delay on the order of 10 nanoseconds or less at room temperature. These transitional rise and fall times and the propagation time thereof by the current-steering logic gate are relatively small and will hereinafter be considered as steep or substantially instantaneous transitions in signal level which are propagated substantially instantaneously by the current-steering logic gate. Moreover, the term transition is hereinafter used in the specification and the appended claims to denote these steep transitions unless otherwise modified.

To summarize the operation of the current-steering logic gate, refer to the truth table in FIG. 2. Whenever either or both of the input signals A and B is at the higher digital level H, the output signal C at output terminal 7 is at the lower digital level L. It is only when both input signals A and B are at the lower digital level that the output signal C is at the higher digital level H. The complementary output signal $\overline{C}$ appears at output terminal 6 in FIG. 1. If the binary symbols "1" and "0" are assigned to the higher and lower levels respectively, the gate can be said to function as a NOR gate with respect to the output signal C and as an OR gate with respect to the output signal $\overline{C}$.

FIG. 3 is a symbolic representation of the current-steering logic gate of FIG. 1. The inputs A and B correspond to the inputs A and B in FIG. 1. The outputs C and $\overline{C}$ correspond to the similarly designated outputs in FIG. 1. It is assumed that the symbol includes all of the circuitry in FIG. 1 except for the voltage source E. This symbol will be used throughout the specification to represent the circuit of FIG. 1.

Referring now to FIGS. 4 and 5 there is illustrated a delay system useful in data processing operations. The general illustration of FIG. 4 includes a regenerative type of one-shot multivibrator or delay circuit 10 having a relatively long delay. The one-shot circuit 10 delays the input transition 11 and produces complementary digital output signals *g* and *h*, the time duration of which is indicative of the delay of the circuit 10. The digital signals at *g* and *h* are applied to another one-shot multivibrator 12 of a nonregenerative type having a relatively short time delay. The multivibrator circuit 12 develops relatively short time duration complementary digital output signals at its outputs *l* and *m*. The leading edges or transitions of these complementary output signals commence with the occurrence of the trailing edges or transitions of the digital signals at *g* and *h*. The time duration of these output signals at *l* and *m* is indicative of the delay of the one-shot circuit 12.

In FIG. 5*a* the relatively long time delay circuit 10 includes a pair of current steering logic gates 13 and 14 cross coupled to one another to form a flip-flop 15. To this end, the NOR output of gate 13 is coupled to an input 16 of the gate 14; while the NOR output of gate 14 is coupled to an input 17 of the gate 13. An input 18 of the gate 13 corresponds to a set input and receives digital input signals at *a*.

The output of the flip-flop, designated *b* which corresponds to the OR output of the logic gate 13 is connected to an input 21 of a current steering logic gate 20. The logic gate 20 does not include a resistance R4 connected between the NOR output 7 and the circuit point 4 as shown in FIG. 1. Instead, a discrete resistance R24 is connected between the NOR output of the logic gate 20 and the circuit point 4 as illustrated in FIG. 5*b*. As in FIG. 1, appropriate operating potential such as a voltage source E is connected to the circuit point 4 of the gate 20. The same voltage source may also be connected to the circuit point 4 of the aforementioned logic gates 13, 14 and 20 and also to the current steering logic gates to be hereinafter described. The NOR output of the logic gate 20 is also connected by way of a discrete resistance R6 to one terminal of a discrete capacitor C1. The other terminal of the capacitance C1 is coupled to the circuit point 4.

Another current steering logic gate 23 has an input 25 connected to the junction of the capacitance C1 and the resistance R6, designated as *d*. A waveshaping network 24 includes a resistance R7 and a diode D1 connected between a circuit point 26 and the OR output of the logic gate 23, also designated as *e*. Connected between the circuit point 26 and the ground reference G is a tunnel diode TD1. Also connected to the circuit point 26 is the base electrode of a transistor Q6. The emitter electrode of transistor Q6 is connected to ground. The collector electrode of transistor Q6 is connected by way of a diode D2 to a circuit point 27. Circuit point 27 is connected to ground by way of a resistance R8. The circuit point 27 is further connected by way of resistance R9 to the circuit point 4. The circuit point 27 also designated as *f* is further connected to the flip-flop 15 at an input 19 of the logic gate 14.

A further current steering logic gate 28 has an input 29 connected to the waveshaping network at circuit point 27 and an input 30 connected to the NOR output of the logic gate 13. The NOR and OR outputs of the current-steering logic gate 28 may be brought out to terminals 31 and 32, respectively.

The flip-flop 15 becomes set in response to digital input signals of the type illustrated in either FIG. 6*a* or FIG. 7*a* to provide first and second complementary signals of the type illustrated in FIGS. 6*b* and 6*c* or 7*b* and 7*c* at the OR and NOR outputs respectively of the gate 13. The digital input signal of FIG. 6*a* has a time duration relatively shorter than the period of the delay of the circuit 10; while the digital input signal of FIG. 7*a* has a time duration relatively longer than the delay of the circuit 10. In FIGS. 6 and 7 the waveforms designated *a*, *b* . . . *m* correspond to the waveforms developed at the similarly designated points in FIG. 5*a*. Each of the digital signals illustrated in FIGS. 6*a* and 7*a* has a leading edge 40 which is a transition from the lower to the higher of two digital voltage levels 41 and 42. As aforementioned, the lower digital level 41 and the higher digital level 42 may be −1.6 volts and −0.8 volt respectively. Moreover, each of the waveforms illustrated in FIGS. 6 and 7 consists of transitions between the same two voltage levels. Also, as aforementioned, the leading edge or transition 40 is so steep that it occurs almost instantaneously. Accordingly, the leading edge 40 is illustrated as occurring at a time $t_0$ in FIGS. 6 and 7. Since the propagation delay of the current-steering logic gate 13 is relatively short as previously described, the leading edges or transitions of the complementary output signals are also illustrated as occurring at time $t_0$.

The waveform *c* developed at the NOR output is applied to the input 30 of logic gate 28. At this time, the waveform *f* applied to the input 29 of the logic gate 28 is at the lower level. Since the waveform *c* changes from the higher to the lower level, the complementary NOR and OR outputs of the gate 20 abruptly change in opposite directions as illustrated by waveforms *g* and *h* in FIGS. 6 and 7. These abrupt changes signify the beginning of the delay period.

The current-steering logic gate 20 and the capacitance C1 constitute a first means which inverts and substantially decreases the slope of the leading edge or transition of the digital signal *b* developed at the OR output of the gate 13. Just prior to time $t_0$ the waveform *b* is at the lower digital level so that the NOR output of the gate 20 is at the higher level. Thus, the capacitance C1 is at this time charged to substantially −0.8 volt by way of a path which includes the resistance R6, the base-emitter junction of transistor Q5 and the resistance R1 of the gate 20 as illustrated by the dashed line designated CHARGE in FIG. 5*b*. As the input transition occurs at time $t_0$, the NOR output of the logic gate 20 tries to change to the lower level of −1.6 volts. However, the capacitance C1 prevents this change until it discharges in a path including resistances R6 and R24 toward the negative terminal of the voltage source E as illustrated by the dashed line designated DISCHARGE in FIG. 5*b*. The resistance R24 is selected to be very large relative to resistance R6 so that the discharge time of capacitance C1 is quite long compared to the charge time thereof. By way of example, the resistance R6 may be on the order of 82 ohms; the resistance R24 may be on the order of 22 kilohms; and capacitance C1 may be on the order of 120 microfarads. The resistances R6 and R24 and the capacitance C1 are discrete components of a desired tolerance. The waveforms in FIGS. 6*d* and 7*d* illustrate the discharge of the capacitance C1 as a gradual transition from the higher digital level toward the lower digital level having a slope considerably smaller than the slope of the *a* and *b* waveforms in either of FIGS. 6 or 7. The waveform *d* is also inverted with respect to the *a* and *b* waveforms.

The current-steering logic gate 23 and a waveshaping network 24 constitute a second means for detecting the equivalence of the gradual transition of the waveform *d* with a predetermined voltage level intermediate the values of the two digital levels 41 and 42 and for developing a control signal having a transition between the two voltage levels when equivalence is so detected. As previously described, the current-steering logic gates are preferably biased so as to respond when the transition of the input signal is midway between the higher and lower digital voltage levels. Thus, the predetermined voltage level is −1.2 volts; and logic gate 23 begins to switch when the gradually sloping waveform *d* has this value at time $t_2$. At this time, the waveform *e* in FIGS. 6 and 7 begins to change from the higher toward the lower level, the slope of the transition being greater than the slope of the gradually sloping waveform *e*.

When the waveform *e* is at its higher level prior to time $t_2$, transistor Q6 of the waveshaping network 24 is biased in the cutoff condition. The tunnel diode TD1 is biased so as to conduct just enough current to satisfy the leakage current requirements of transistor Q6, The diode D1 is slightly reverse biased at this time. As the logic gate 20 begins to switch, its OR output *e* becomes more negative. The diode D1 begins to conduct; and the tunnel diode TD1 conduction exceeds its peak current and switches rapidly (less than a nanosecond) to its high voltage low current condition. The voltage developed by the tunnel diode turns on transistor Q6. The waveform *f* at the circuit point 27 changes abruptly from the lower to the higher level.

This control transition at time $t_3$ of the waveform *f* causes the logic gate 28 to switch so that the complementary NOR and OR outputs thereof abruptly change in opposite directions as illustrated by waveforms *g* and *h* in FIGS. 6 and 7. These transitions signify the end of the delay period.

The waveform *f* is also applied to the flip-flop 15 at the input 19 of the logic gate 14 in order to reset the flip-flop. For the case illustrated in FIG. 6 where the input signal is of shorter time duration than the delay period of the one shot multivibrator 10, the waveform *f* resets the flip-flop at time $t_3$. The complementary NOR and OR outputs of the logic gate 13 abruptly change to the higher and lower levels as respectively illustrated in waveforms *c* and *b* of FIG. 6. The capacitance C1 begins to rapidly charge toward the higher voltage level of −0.8 volt through the low impedance path illustrated by the dashed line in FIG. 5*b*. By the time $t_4$ the capacitance C1 is fully charged to −0.8 volt and the OR output of the logic gate 23 has returned to its initial higher voltage level resetting tunnel diode TD1 and cutting off transistor Q6. The waveform *f* also returns to the lower level of −1.6 volts.

For the case illustrated in FIG. 7 where the time duration of the input signal is greater than the delay period of the one-shot multivibrator 10, the flip-flop 15 does not reset until the input signal terminates at time $t_9$. Allowing a short time for the capacitance C1 to charge, the logic gates 20 and 23 and the waveshaping network 24 revert to their respective initial conditions by time $t_{10}$. It is apparent that the waveforms *d* and *e* in FIG. 7 may or may not decrease to the lower voltage level of −1.6 volts depending upon the time duration of the input signal. For purposes of illustration these waveforms are shown to attain the −1.6 volts level at time $t_8$.

The relatively short time delay one-shot multivibrator 12 includes a current-steering logic gate 34 having an input 33 coupled to the OR output of the logic gate 28. The logic gate 34 is similar to the logic gate 20 illustrated in detail in FIG. 5*b*. The resistances R7 and R25 correspond to resistances R6 and R24, respectively; while the capacitance C2 corresponds to the capacitance C1.

Another current-steering logic gate 36 has an input 35 connected to the junction of capacitance C2 and the resistance R6 at the point *j*. The NOR output of the logic gate 36 is connected to an input 38 of an output current-steering logic gate 39. The other input 37 of the logic gate 39 is connected to the NOR output of the logic gate 28. The NOR and OR outputs of the logic gate 39 are designated as *l* and *m*, respectively.

The one-shot multivibrator 12 is operative to provide relatively short time duration signals commencing with the trailing edges or transitions of the complementary NOR and OR outputs of the logic gate 28. Prior to time $t_0$ the waveform *g* is at the higher voltage level of −0.8 volt so that the NOR output of the logic gate 34 and the capacitance C2 are at the lower voltage level of −1.6 volts as illustrated by the waveform *j*. With the waveform *j* at the lower voltage level, the NOR output of the logic gate 36 is at the higher voltage level of −0.8 volt as illustrated by the waveform *k*. Since the waveform *k* is at the higher voltage level, the NOR and OR outputs of the logic gate 39 are at the low and high voltage levels, respectively, as illustrated by waveforms *l* and *m* in FIGS 6 and 7.

When the logic gate 28 switches at time $t_0$, the waveform *g* changes from the higher to the lower voltage level. The NOR output of the logic gate 34 attempts to change from the lower to the higher voltage level at this time. Since the voltage on the capacitor C2 cannot change instantaneously, there is a slight delay until the capacitance charges by way of resistance R7 in a path like the one illustrated in FIG. 5*b*. The resistance R7 is relatively small so that the charge time is almost negligible. The waveform *j* in FIGS. 6 and 7 illustrates that the capacitance C2 becomes charged to the higher voltage level at time $t_1$. The logic gate 36 begins to switch when the leading edge of the waveform *j* is equal to −1.2 volts. The NOR output of this logic gate changes to the lower voltage level by time $t_1$ as illustrated by waveform *k*.

Although the waveform *k* changes from the higher to the lower voltage level between times $t_0$ and $t_1$, the logic gate 39 does not change its condition because the waveform *h* changes from the lower to the higher level at time $t_1$. Thus, prior to and immediately after times $t_0$ and $t_1$, there is at least one input to the gate 39 at the higher voltage level.

At time $t_3$ the waveform *h* changes from the higher to the lower voltage level. Since both the waveform *h* and the waveform *k* are at the lower voltage level, the logic gate 39 switches signifying the beginning of the delay period. The waveform *l* changes abruptly from the lower to the higher voltage level; while the waveform *m* changes in the opposite direction.

When the waveform *g* changes to the lower level at time $t_3$, the NOR output of the logic gate 34 tries to change from the higher to the lower voltage level. However, it is prevented from so doing until the capacitance C2 discharges by way of resistance R7 and R25 toward the negative side of the voltage source E in a path like the one illustrated in FIG. 5*b*. The resistance R25 is selected to be much larger than the resistance R7 so that the discharge time is much longer than the charge time of the capacitance. By way of example the resistance R7 may be on the order of 82 ohms; the resistance R25 may be on the order of 1400 ohms; and the capacitance may be on the order of .01 microfarad. The resistances R7 and R25 and the capacitance C2 are discrete components of a desired tolerance. The waveform *j* in FIGS. 6 and 7 illustrates the discharge of capacitance C2 as a gradual transmission which is somewhat steeper than the gradual transition of the waveform *d*.

When the waveform *j* becomes equal to −1.2 volts at time $t_5$, the logic gate 36 begins to switch. Its NOR output, illustrated by the waveform *k*, changes from the lower to the higher voltage level. When the waveform *k* becomes equal to −1.2 volts, the logic gate 39 begins to switch at time $t_6$. By time $t_7$ the *l* and *m* waveforms have returned to their initial conditions signifying the end of the delay period.

There has been described an interconnection of eight emitter-coupled current steering logic gates with two discrete capacitances and four discrete resistances to form a delay system. Although the current steering logic gates have been illustrated as comprising transistors of the NPN type, it is apparent that the logic gates may be comprised of PNP type transistors provided that the polarity of the voltage source E is changed. For this type of logic gate, the polarities of the diodes D1 and TD1 and the conductivity type of the transistor Q6 would also have to be changed. Moreover, it is apparent that other waveshaping networks may be used in place of the particular one illustrated in FIG. 5*a*. All that is necessary is that the waveshaping network be capable of converting a gradually sloping ramp signal of the type illustrated in waveform *e* into a digital signal having a steep leading transition of the type illustrated in waveform *f* in FIGS. 6 and 7.

The logic gate 23 may not be needed under certain circumstances. With the capacitance C1 voltage or waveform *d* changing relatively slowly, the logic gate 23 is necessary to develop enough current to exceed the threshold of the waveshaping network 24. Where the capacitance voltage changes more rapidly or where the waveshaping network responds adequately to the capacitance voltage itself, logic gate 23 is not needed.

What is claimed is:

1. A circuit comprising at least first, second, third and fourth logic gates each having an input means and first and second complementary outputs, means for cross coupling the first complementary outputs and the input means of said first and second logic gates,
means for coupling the second complementary output and for further coupling the first complementary output of said first logic gate to the input means of said third and fourth logic gates, respectively, and
means including a capacitance and a waveshaping network for coupling the first complementary output of said third logic gate to the input means of said second and fourth logic gates.

2. A circuit comprising
first, second, third, fourth and fifth logic gates each having an input means and first and second complementary outputs,
means for cross coupling the first complementary outputs and the input means of said first and second logic gates,
means for coupling the second complementary output and for further coupling the first complementary output of said first logic gate to the input means of said third and fifth logic gates, respectively,
means including a capacitance for coupling the first complementary output of said third logic gate to the input means of fourth logic gate, and
means including a waveshaping network for coupling the second complementary output of said fourth logic gate to the input means of said second and fifth logic gates.

3. A circuit comprising
at least first, second, third, fourth, fifth, sixth and seventh logic gates each having an input means and first and second complementary outputs,
means for cross coupling the first complementary outputs and the input means of said first and second logic gates,
means for coupling the second complementary output and for further coupling the first complementary output of said first logic gate to the input means of said third and fourth logic gates, respectively,
means including a capacitance and a waveshaping network for coupling the first complementary output of said third logic gate to the input means of said second and fourth logic gates,
means for coupling the first and second complementary output means of said fourth logic gate to the input means of said seventh and fifth logic gates, respectively,
means including a capacitance for coupling the first complementary output of said fifth logic gate to the input means of said sixth logic gate, and
means for coupling the first complementary output of said sixth logic gate to the input means of said seventh logic gate.

4. In a system which responds to transitions between first and second voltage levels, a delay circuit comprising,
a flip-flop having a pair of inputs and first and second outputs, said flip-flop becoming set in response to an input transition from said first to said second voltage level at one of its inputs,
first means including a first logic gate having a capacitance coupled to an output thereof for developing a gradual transition between said first and second voltage levels in response to the setting of said flip-flop,
second means for developing a control transition between said first and second voltage levels when said gradual transition equals a predetermined voltage level intermediate said first and second voltage levels,
third means including a second logic gate for developing first complementary transitions between said first and second voltage levels in response to the setting of said flip-flop and for developing second complementary transitions in response to said control transition developed by said second means, and
fourth means for applying said control transition to the other of said flip-flop inputs, said flip-flop resetting in response thereto.

5. In a system which responds to transitions between first and second voltage levels, a delay circuit comprising,
a flip-flop having a pair of inputs and first and second outputs, said flip-flop becoming set in response to an input transition from said first to said second voltage level at one of its inputs,
first means including a first logic gate having a first capacitance coupled to an output thereof for developing a first gradual transition between said first and second voltage levels in response to the setting of said flip-flop,
second means for developing a control transition between said first and second voltage levels when said first gradual transition equals a predetermined voltage level intermediate said first and second voltage levels,
third means including a second logic gate for developing first complementary transitions between said first and second voltage levels in response to the setting of said flip-flop and for developing second complementary transitions in response to said control transition, the time occurring between said first and second complementary transitions being indicative of a first delay,
fourth means for applying said control transition to the other of said flip-flop inputs, said flip-flop resetting in response thereto,
fifth means including a third logic gate having a second capacitance coupled to an output thereof for developing a second gradual transition between said first and second voltage levels in response to said second complementary transitions, and
sixth means including a fourth logic gate for developing a first output transition between said first and second voltage levels in response to said second complementary transitions and for developing a second output transition between said first and second voltage levels when said second gradual transition is equal to said predetermined voltage level, the time occurring between said first and second output transitions being indicative of a second delay.

6. The invention as claimed in claim 5 wherein said first delay is relatively longer than said second delay.

7. The invention as claimed in claim 3 wherein said logic gates perform NOR and OR functions with respect to said first and second complementary outputs, respectively.

8. A circuit comprising:
input means for developing a digital input signal and its complement, each having a leading and a trailing edge;
first and second logic gate means each having input means and output means;
first means for applying one of said input and complement signals to the input means of the first logic gate;
second means including a capacitance coupled to the output means of the first logic gate for developing a ramp signal in response to the trailing edge of said one signal;
third means for applying the other of said input and complement signals to the input means of said second logic gate means whereby said second logic gate responds to the leading edge of said other signal to develop the leading edge of an output signal; and
fourth means for applying said ramp signal to the input means of the second logic gate means whereby said second logic gate means responds to said ramp voltage being equal to a predetermined voltage level to develop the trailing edge of the output signal.

9. The invention according to claim 8:
wherein the second logic gate means includes a comparator gate and an output gate each having an input means and an output means, the output means of the comparator gate being coupled to the input means of the output gate;

wherein said third means applies said other signal to the input means of the output gate; and wherein said fourth means includes means for applying said ramp signal to the input means of the comparator gate, whereby the comparator gate switches when the ramp voltage becomes equal to the predetermined voltage and whereby said output gate develops the trailing edge of the output signal in response to said switching of the comparator gate.

References Cited

UNITED STATES PATENTS

| | | | |
|---|---|---|---|
| 3,007,060 | 10/1961 | Guenther | 307—88.5 |
| 3,107,306 | 10/1963 | Dobbie | 307—88.5 |
| 3,192,408 | 6/1965 | Cho | 307—88.5 |

ARTHUR GAUSS, *Primary Examiner.*

S. D. MILLER, *Assistant Examiner.*